(12) United States Patent
Christiansen

(10) Patent No.: US 6,243,598 B1
(45) Date of Patent: *Jun. 5, 2001

(54) METHOD OF PREPARING RARE EARTH-BARIUM CUPRATES SUPERCONDUCTORS

(75) Inventor: Jens Christiansen, Lyngby (DK)

(73) Assignee: Haldor Topsoe A/S, Lyngby (DK)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/038,989

(22) Filed: Mar. 12, 1998

Related U.S. Application Data

(60) Provisional application No. 60/042,332, filed on Mar. 21, 1997.

(51) Int. Cl.$^7$ .................................................. C30B 29/22
(52) U.S. Cl. ....................... 505/230; 505/236; 505/430; 505/450
(58) Field of Search .................... 505/230, 236, 505/430, 450

(56) References Cited

U.S. PATENT DOCUMENTS

| | | | |
|---|---|---|---|
| 4,994,437 | 2/1991 | Torri et al. | 505/452 |
| 5,434,129 | 7/1995 | Motowidlo et al. | 505/433 |
| 5,474,976 * | 12/1995 | Kondoh et al. | 505/450 |
| 5,527,765 * | 6/1996 | Hodge et al. | 505/450 |
| 5,536,704 * | 7/1996 | Yamada et al. | 505/450 |
| 5,591,698 * | 1/1997 | Song et al. | 505/450 |
| 5,856,277 * | 1/1999 | Chen et al. | 505/450 |
| 5,866,515 * | 2/1999 | Dorris et al. | 505/230 |
| 5,872,081 * | 2/1999 | Woolf | 505/450 |
| 5,935,911 | 8/1999 | Yamada et al. | 505/230 |

FOREIGN PATENT DOCUMENTS 0756336  1/1997  (EP).

OTHER PUBLICATIONS

S.I. Yoo et al., "Melt Processing for Strong Flux Pinning in RE–Ba–Cu–O (RE: Nd, Sm, Eu, Gd) Superconductors", Journal of Electronic Materials, vol. 24, No. 12, Dec. 1995, pp. 1923–1930.

* cited by examiner

Primary Examiner—Robert Kunemund
(74) Attorney, Agent, or Firm—Ostrolenk, Faber, Gerb & Soffen, LLL

(57) ABSTRACT

A method of preparing a rare earth-barium-cuprate superconductor in the form of metallic tapes or wires, using a thick film or powder-in-tube process by supporting on a metallic substrate a mixture of seed crystals or aligned platelets of rare earth-barium cuprate having a high melting point and rare earth-barium-cuprate powder having a lower melting point. The material supported on the substrate is then subjected to a heat treatment at a temperature below the melting point of the high melting rare earth-barium-cuprate seed crystals and the metallic substrate and above the melting point of the low melting powder. Subsequently, the heat treated supported material is cooled below the melting temperature of the material and annealed.

12 Claims, No Drawings

METHOD OF PREPARING RARE EARTH-BARIUM CUPRATES SUPERCONDUCTORS

This application claims the benefit of U.S. Provisional Application Ser. No. 60/042,332, filed Mar. 21, 1997.

BACKGROUND OF THE INVENTION

1. Field of the Invention

The present invention relates to a method of preparing rare earth-barium-cuprates superconductors by melt texturing of the superconducting material on a metallic substrate.

2. Description of the Related Art

Heretofore, melt texturing of rare earth-barium-cuprate superconducting materials on silver substrates have been prohibited in air by the high melting point of the material in air exceeding the melting point of silver in air.

It has previously been demonstrated, however, that the melting point of $RE_{1+y}Ba_{2-y}Cu_3O_{7-x}$ ($0 \leq y \leq 0.9$, $0 \leq x \leq 1$) (RE) phases decreases as the partial oxygen pressure, i.e. $p(O_2)$, decreases. Furthermore, it is well known that the melting point of silver increases as $p(O_2)$ decreases.

SUMMARY OF THE INVENTION

Given the above, the present invention recognizes that it is possible to produce rare earth-barium cuprate superconductors on silver substrates by melting several RE123 phases below the melting point of silver at low $p(O_2)$. As such, the method of this invention is based on the principle of changing the melting points (peritectic decomposition temperature) of the rare earth-barium-cuprate superconductors (RE123, RE=Y, La, Nd, Sm, Eu, Gd, Dy, Ho, Er, Tm, Yb, Lu, and mixtures thereof), including the non-superconducting Pr123 phase of the above formulation and of the melting point of silver as a function of $p(O_2)$ More specifically, the invention provides a method of preparing a rare earth-barium-cuprate superconductor, preferably in the form of metallic tapes or wires, using a thick film or powder-in-tube process by supporting on a metallic substrate a mixture of seed crystals or aligned platelets of a rare earth-barium cuprate phase having a high melting point and a rare earth-barium-cuprate powder phase having a lower melting point. The material supported on the substrate is then subjected to a heat treatment at a temperature below the melting point of the high melting rare earth-barium-cuprate seed crystals and the metallic substrate and above the melting point of the low melting powder. This treatment may be performed in an atmosphere having a partial pressure of oxygen lower than the partial pressure of oxygen in air. Subsequently, the heat treated supported material is cooled below the melting temperature of the material and annealed.

DETAILED DESCRIPTION OF THE PREFERRED EMBODIMENT

According to a preferred embodiment of the present invention, a highly textured microstructure of the RE123 material is obtained by providing on a silver substrate a mixture of $RE_{1+y}Ba_{2-y}Cu_3O_{7-x}$ ($0 \leq y \leq 0.9$, $0 \leq x \leq 1$) material comprising one phase of aligned RE123 platelets or seed crystals having a relatively high melting point and a second phase of a RE123 powder having a melting point lower than that of the RE123 platelets. The mixture is placed in an environment having a reduced partial pressure of oxygen sufficient to raise the melting point of silver to a temperature at least above the melting point of the lower melting RE123 phase. The mixture is then heated to a temperature above the melting point of the RE123 powder but below the melting point of the RE123 platelets and of the silver substrate. Subsequently, the material is solidified by nucleation and expitaxial growth of the low melting point RE123 phase on the platelets or crystals during cooling. As a final step in the process, the solidified material is annealed in pure oxygen to provide the finished superconductor product.

Using the above-described process, RE123/silver wires and tapes having a highly aligned RE123 material are produced using conventional "powder in tube" and "thick film" technologies. For example, wires and tapes produced with a "powder-in-tube" process requires placing the RE123 mixture inside a silver tube. The tube is evacuated, sealed, and pulled or stretched and then shaped into a tape or wire. After shaping, the tube is subjected to the heat treatment described above. Similarly, using a "thick film" process, the RE123 mixture is coated onto a metallic substrate having a shape of a tape or wire before heat treatment.

Superconductive tapes and wires may also be prepared using other metallic substrates such as nickel and/or stainless steel coated with an inert buffer layer known in the art, such as silver, barium zirconate, magnesium oxide and $RE_2BaCuO_5$.

EXAMPLE

Y123 powder is dry mixed with Nd123 platelets, wherein both phases have a low oxygen content, e.g. $REBa_2Cu_3O_{6+Y}$ ($Y=0$–$0.5$), and the mixture is poured into a silver tube. After evacuating any air from and sealing the tube, the resultant material is drawn and/or rolled several times and finally pressed into a thin tape. The tape is heated to 870–970° C. at $p(O_2)=10^{-5}$–$10^{-2}$ bar, and then cooled to a temperature below the melting point of Y123 at a rate of 0.1–10 K/h. Finally, the tape is annealed at 400–800° C. in pure oxygen.

Although the present invention has been described in relation to a particular embodiment thereof, other variations and modifications will become apparent to those skilled in the art. It is preferred, therefore, that the present invention be limited not by the specific disclosure herein, but only by the appended claims.

What is claimed is:

1. A method for preparing a highly aligned rare earth-barium-cuprate superconductor, comprising the steps of:
   providing a mixture comprising a first phase of aligned rare earth-barium-cuprate platelets or seed crystals having a first melting point and a second phase of rare-earth-barium-cuprate powder having a second melting point, said first melting point being higher than said second melting point;
   supporting said mixture on a substrate;
   shaping said mixture on said substrate;
   subjecting the shaped substrate-supported mixture to heat at a temperature below the melting points of the high melting rare earth-barium-cuprate seed crystals and the metallic substrate, but above the melting point of the low melting powder; and
   cooling the heat treated mixture and substrate to a temperature below the initial melting temperature of the powder to form the shaped and highly aligned superconductive material.

2. The method of claim 1, wherein each rare earth-barium cuprate phase has a formulation given by $RE_{1+y}Ba_{2-y}Cu_3O_{7-x}$ ($0 \leq y \leq 0.9$, $0 \leq x \leq 1$), and wherein RE is an RE123 selected from Y, La, Nd, Sm, Eu, Gd, Dy, Ho, Er, Tm, Yb, Lu, Pr or mixtures thereof.

3. The method of claim 2, wherein the RE123 in the first phase is a different composition than the RE123 in the second phase.

4. The method of claim 1, wherein the metallic substrate is silver.

5. The method of claim 1, wherein the metallic substrate is formed of at least one of nickel and stainless steel, said substrate being further provided with an inert buffer layer.

6. The method of claim 5, wherein the inert buffer layer is selected from silver, barium zirconate, magnesium oxide, and $RE_2BaCu_5$.

7. The method of claim 1, wherein the mixture is supported onto the substrate using a thick film process.

8. The method of claim 1, further comprising the step of annealing the cooled superconductive material in pure oxygen.

9. The method of claim 1, wherein said mixture on the substrate is heated in an atmosphere having a partial pressure of oxygen lower than the partial pressure of oxygen in air.

10. The method of claim 9, wherein the metallic substrate is silver and the partial pressure of oxygen is sufficient to raise the melting point of silver to a temperature above the melting point of the lower melting phase.

11. The method of claim 1, wherein the mixture on said substrate is shaped into a tape or wire.

12. The method of claim 1, wherein the step of supporting said mixture on a substrate includes placing said mixture inside a metallic tube serving as the substrate, the method further comprising the step of evacuating and sealing said tube after placing said mixture inside, and wherein the shaping step includes pulling or stretching said tube having the mixture therein into the shape of a tape or wire.

* * * * *